US012764890B2

(12) United States Patent
Pritchard et al.

(10) Patent No.: US 12,764,890 B2
(45) Date of Patent: Oct. 13, 2026

(54) MULTIPLE DRIVE ASSEMBLY FOR A SERVER RACK

(71) Applicant: Dell Products L.P., Round Rock, TX (US)

(72) Inventors: Jason Charles Pritchard, Hopkinton, MA (US); Wuck Foo Wong, Upton, MA (US); Andrew E. Barada, Newton, MA (US)

(73) Assignee: Dell Products L.P., Round Rock, TX (US)

( * ) Notice: Subject to any disclaimer, the term of this patent is extended or adjusted under 35 U.S.C. 154(b) by 107 days.

(21) Appl. No.: 18/973,298

(22) Filed: Dec. 9, 2024

(65) Prior Publication Data

US 2026/0313821 A1 Oct. 8, 2026

(51) Int. Cl.
*H05K 7/14* (2006.01)
*G06F 1/186* (2026.01)

(52) U.S. Cl.
CPC ........... *H05K 7/1489* (2013.01); *G06F 1/186* (2013.01)

(58) Field of Classification Search
CPC .............................. H05K 7/1489; G06F 1/186
See application file for complete search history.

(56) References Cited

U.S. PATENT DOCUMENTS 10,725,532 B1 * 7/2020 Tryhubczak ........ G06F 11/1441
12,016,120 B2 * 6/2024 Ziegler ................ H01R 12/721
12,321,208 B2 * 6/2025 Pritchard ................ G06F 1/189

* cited by examiner

*Primary Examiner* — Henry Tsai
*Assistant Examiner* — John B Roche
(74) *Attorney, Agent, or Firm* — McDermott Will & Schulte LLP

(57) ABSTRACT

A multiple drive assembly, including a first and a second storage unit; a first storage link coupled to the first storage unit; a second storage link coupled to the second storage unit; a third storage link coupled between the first and the second storage links, the third storage link coupled to a drive carrier; a LCC physically coupled to the first storage link, wherein the LCC is coupled to the first storage unit through the first storage link to place the LCC in communication with the first storage unit through the first storage link, wherein the LCC is coupled to the second storage unit through i) the connection between the first and the third storage links and ii) the connection between the third and the second storage links to place the LCC in communication with the second storage unit through the first, the second, and the third storage links.

20 Claims, 6 Drawing Sheets

MULTIPLE DRIVE ASSEMBLY FOR A SERVER RACK

BACKGROUND

Field of the Disclosure

The disclosure relates generally to a multiple drive assembly for a server rack.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes, thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Server storage systems are critical for managing and storing vast amounts of data used by businesses and organizations. These systems can include various storage devices like hard drives, solid-state drives (SSDs), and network-attached storage (NAS) units, often organized in RAID configurations for redundancy and performance. Server storage must ensure data integrity, scalability, and fast access to information, supporting applications like databases, virtual machines, and big data analytics. Efficient storage management and backup solutions are vital to protect against data loss and maintain business continuity.

SUMMARY

Innovative aspects of the subject matter described in this specification may be embodied in a multiple drive assembly, including a first storage unit; a second storage unit; a drive carrier including a rail structure for physically coupling the storage units to the drive carrier; a first storage link physically coupled to the first storage unit; a second storage link physically coupled to the second storage unit; a third storage link physically coupled between the first storage link and the second storage link, the third storage link physically coupled to the drive carrier; and a link control card (LCC) physically coupled to the first storage link, wherein the LCC is coupled to the first storage unit through the first storage link to place the LCC in communication with the first storage unit through the first storage link such that the LCC can transmit data with the first storage unit, wherein the LCC is coupled to the second storage unit through i) the connection between the first storage link and the third storage link and ii) the connection between the third storage link and the second storage link to place the LCC in communication with the second storage unit through the first storage link, the second storage link, and the third storage link such that the LCC can transmit data with the second storage unit.

Other embodiments of these aspects include corresponding systems and apparatus.

These and other embodiments may each optionally include one or more of the following features. For instance, the first storage link and the second storage link are printed circuit boards (PCB). The third storage link is a printed circuit board (PCB). The third storage link is flexible printed circuit board (PCB). The third storage link is coupled to the rail structure of the drive carrier. The drive carrier includes a channel, wherein the third storage link is physically positioned within the channel. The channel is a "U"-shaped channel. The first storage unit is positioned between the second storage unit and the LCC. The first storage unit and the second storage unit are positioned along the same plane.

Particular implementations of the subject matter described in this specification can be implemented so as to realize one or more of the following advantages. For example, a channel is created in a drive carrier to house PCB connectors to enable signals to travel along the edge of the driver carrier to facilitate integration of two disk drives into one disk carrier without sacrificing density. For example, the width of the drive carrier is maintained while adding a second disk drive.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

Figure 1:
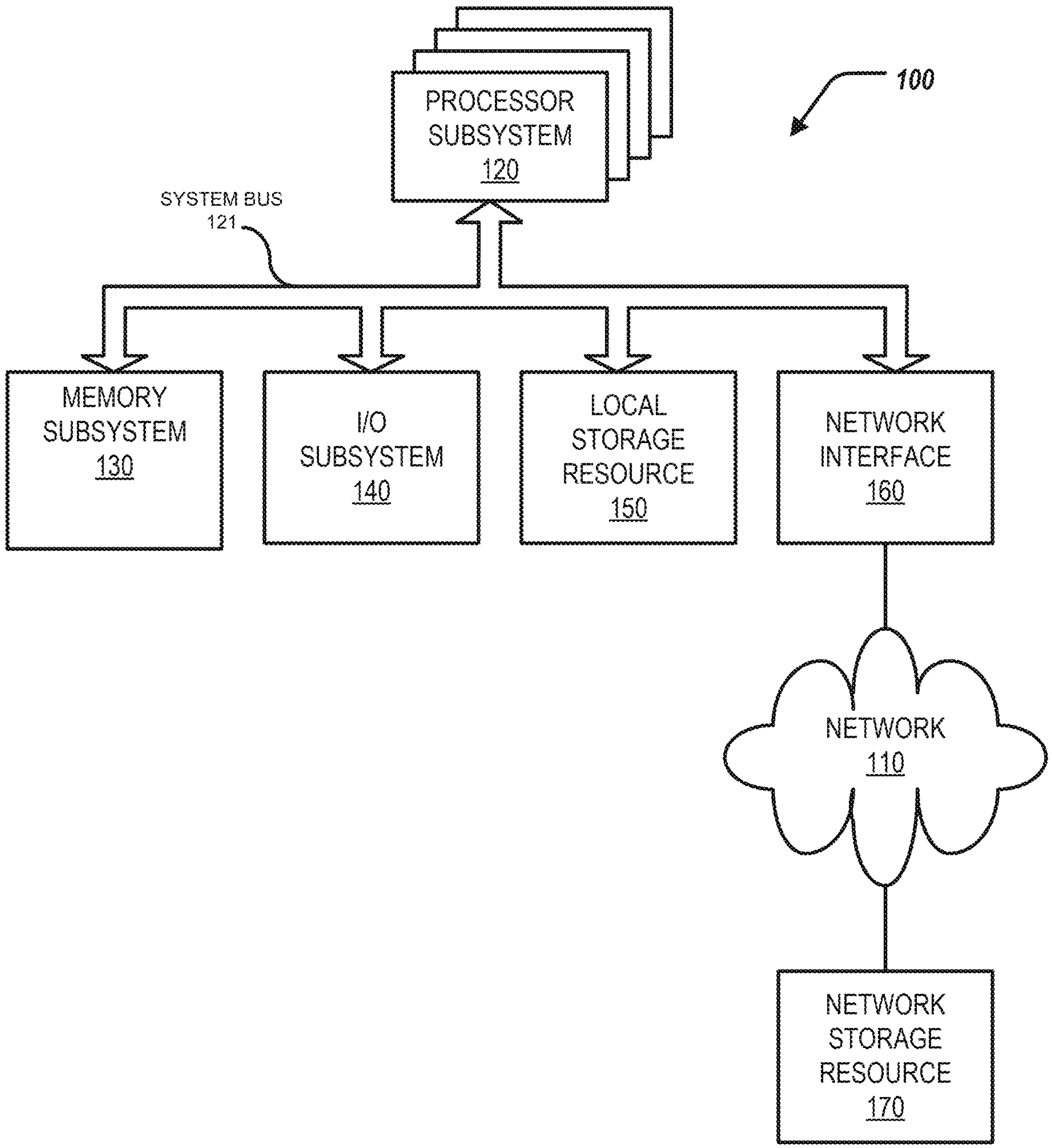
FIG. 1 is a block diagram of selected elements of an embodiment of an information handling system.

This disclosure discusses a multiple drive assembly for a server rack. In short, a drive carrier of the multiple drive assembly can serve a dual purpose—enable coupling with two storage devices, as well as provide space for a storage link to carry signals from a processing module (e.g., a link control card) to both storage devices, including the storage device that is positioned furthest from the processing module, described further herein.

Specifically, this disclosure discusses a multiple drive assembly for a server rack, including a first storage unit; a second storage unit; a drive carrier including a rail structure for physically coupling the storage units to the drive carrier;

a first storage link physically coupled to the first storage unit; a second storage link physically coupled to the second storage unit; a third storage link physically coupled between the first storage link and the second storage link, the third storage link physically coupled to the drive carrier; and a link control card (LCC) physically coupled to the first storage link; wherein the LCC is coupled to the first storage unit through the first storage link to place the LCC in communication with the first storage unit through the first storage link such that the LCC can transmit data with the first storage unit, wherein the LCC is coupled to the second storage unit through i) the connection between the first storage link and the third storage link and ii) the connection between the third storage link and the second storage link to place the LCC in communication with the second storage unit through the first storage link, the second storage link, and the third storage link such that the LCC can transmit data with the second storage unit.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such as wires, optical fibers, microwaves, radio waves, and other electromagnetic and/or optical carriers; and/or any combination of the foregoing.

Particular embodiments are best understood by reference to FIGS. 1-7 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include one or more processing resources such as a central processing unit (CPU), microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of the information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, a camera, or another type of peripheral device.

Local storage resource 150 may comprise computer-readable media (e.g., hard disk drive, floppy disk drive, CD-ROM, and/or other types of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other types of rotating storage media, flash memory, EEPROM, and/or other types of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g., corporate) network. The network may be implemented as, or may be a part of, a storage area network (SAN), a personal area network (PAN), a local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g., customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet, or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
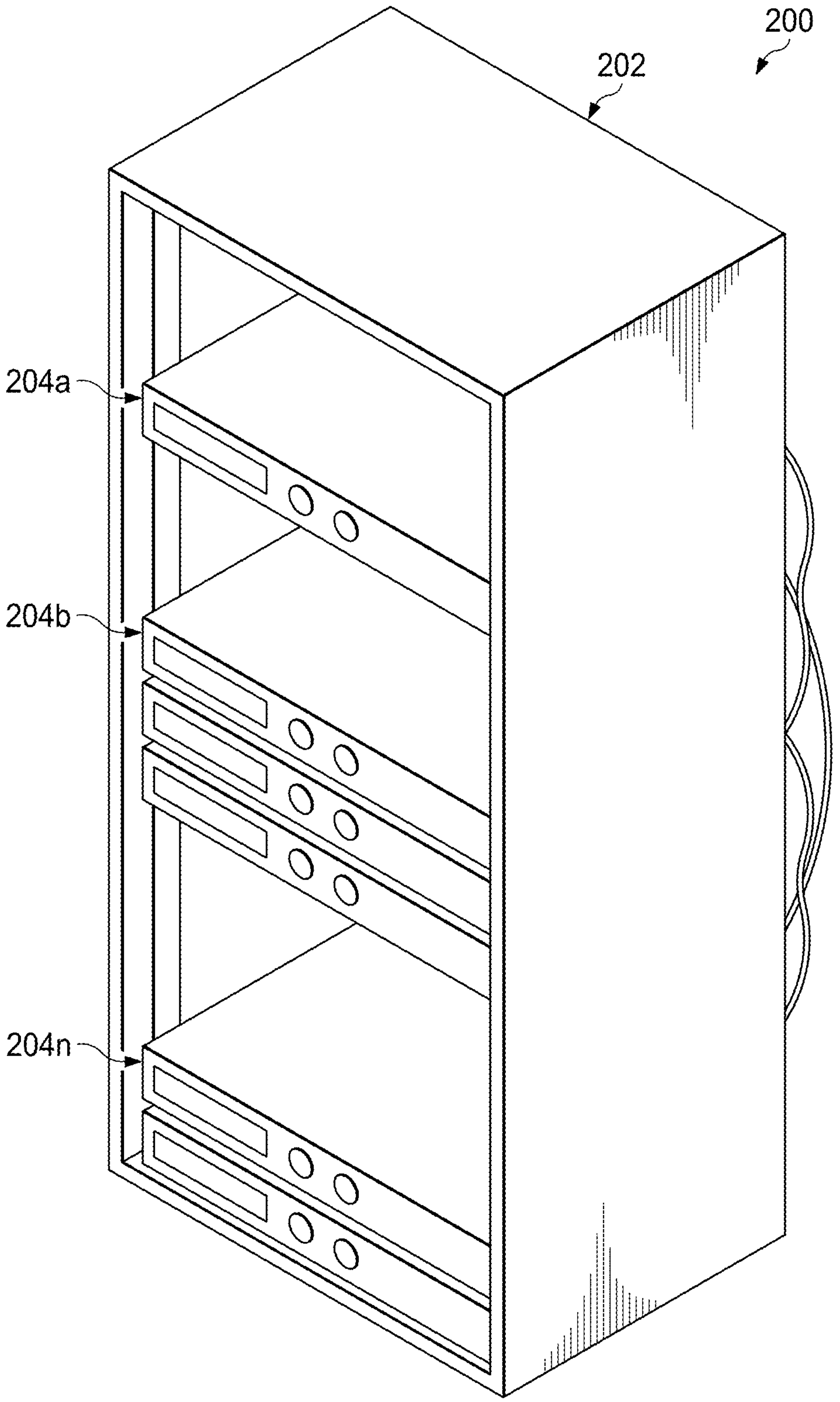
FIG. 2 illustrates a simplified perspective view of a server rack.

Turning to FIG. 2, FIG. 2 illustrates an environment 200 including a server rack 202. The server rack 202 can include chassis 204*a*, 204*b*, . . . , 204*n* (collectively referred to as chassis 204). In some examples, the chassis 204 can include the information handling system 100 of FIG. 1.

Figure 3:
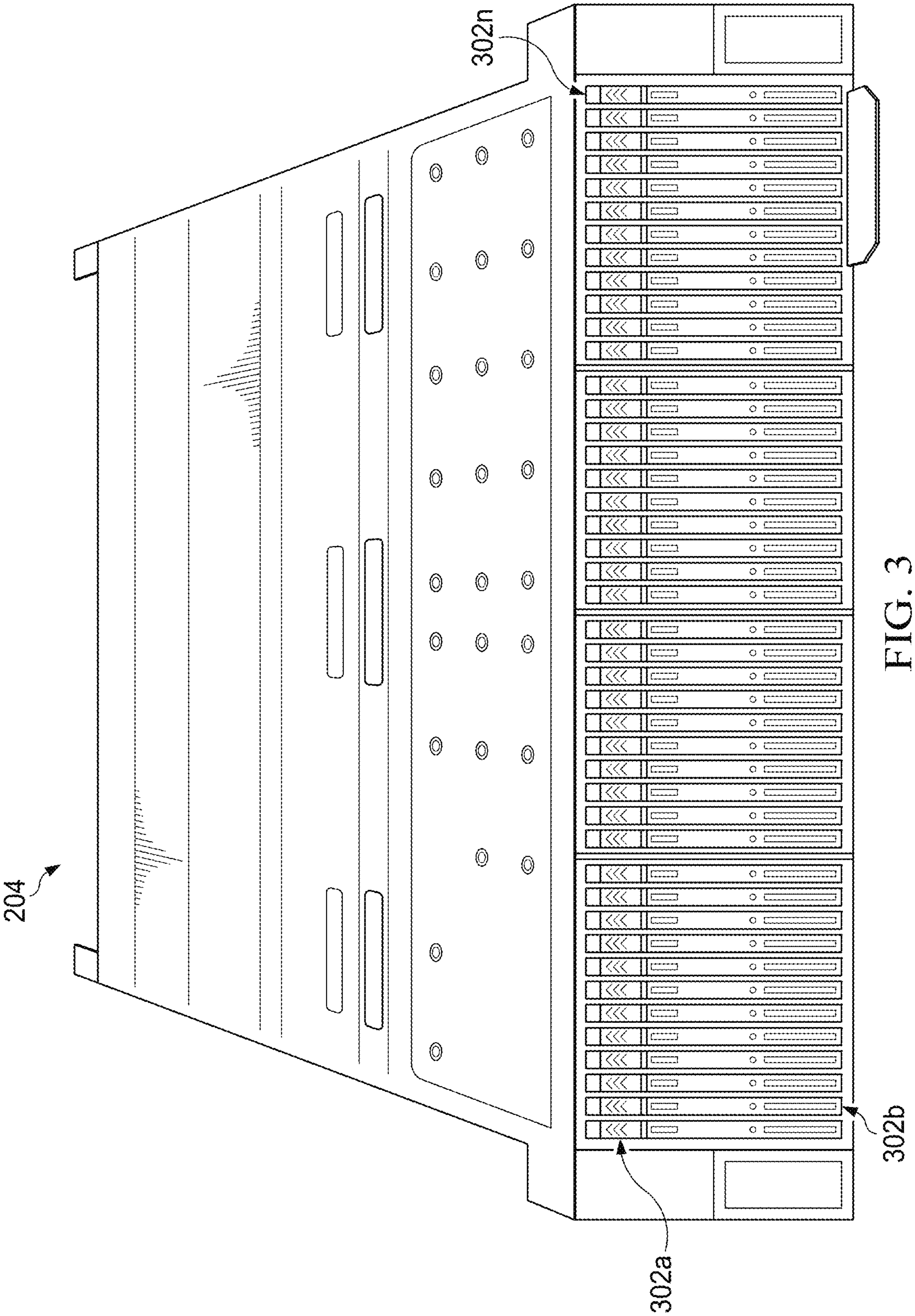
FIG. 3 illustrates a perspective view of a chassis for the server rack.

FIG. 3 illustrates a perspective view of the chassis 204 of the server rack 202. The chassis 204 can include a plurality of multiple drive assemblies 302*a*, 302*b*, . . . , 302*n*. For example, the chassis 204 can include forty-four multiple drive assemblies 302; however, the chassis 204 can include any number of multiple drive assemblies 302.

Figure 4:
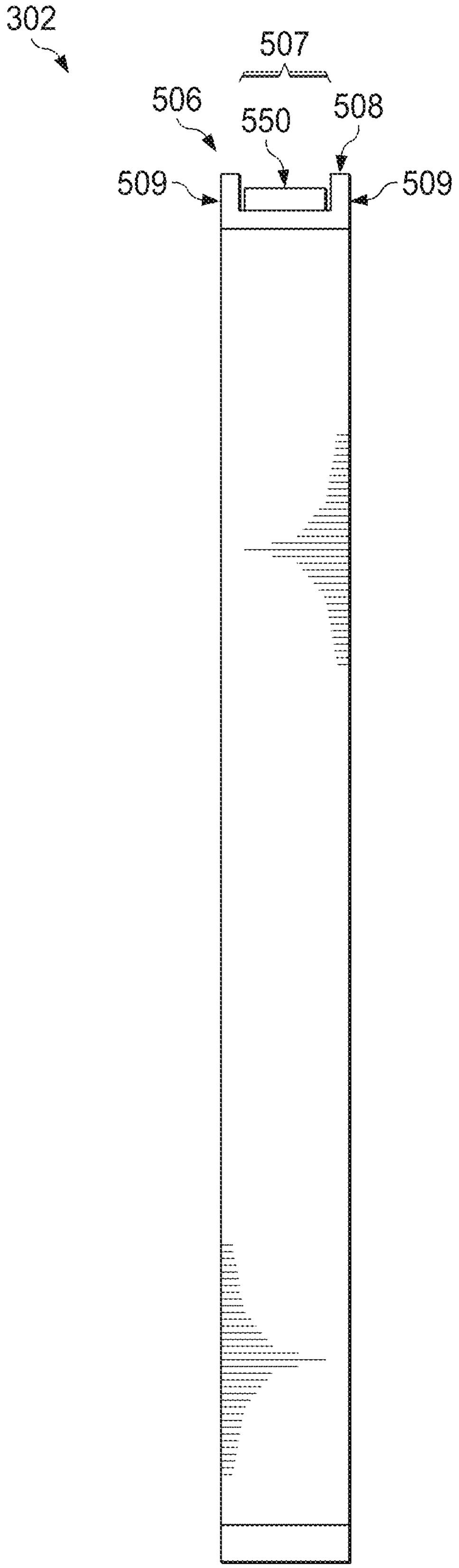
FIG. 4 illustrates a front cross-sectional view of a multiple drive assembly of the chassis of the server rack.
Figure 5:
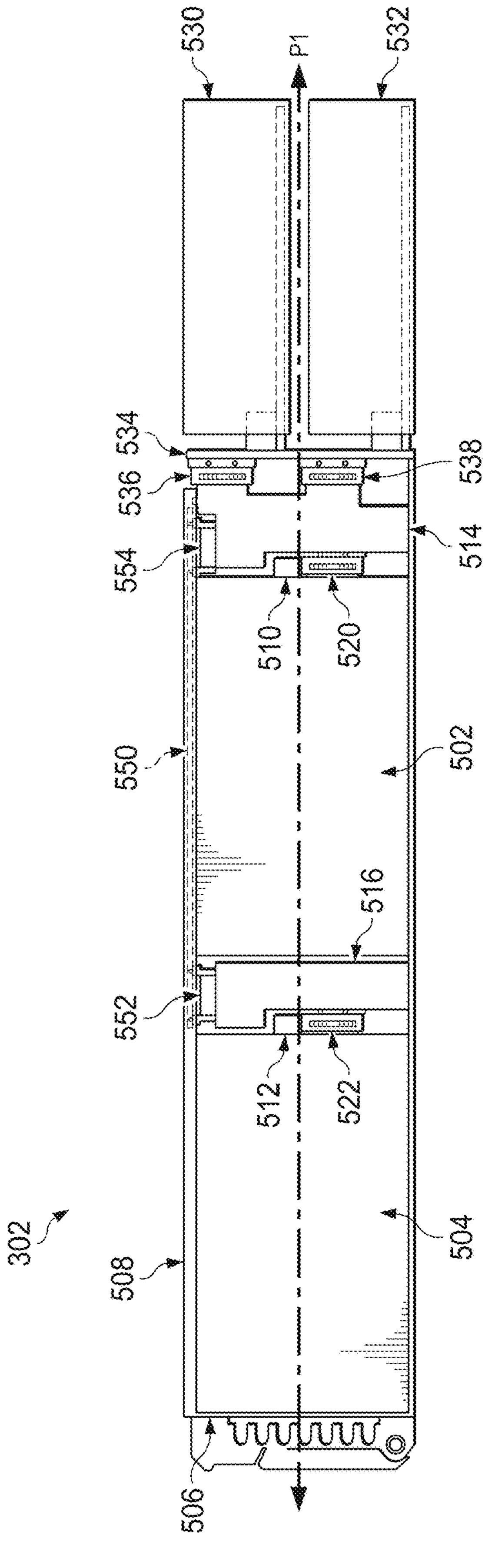
FIG. 5 illustrates a side view of the multiple drive assembly of the chassis of the server rack.

FIG. 4 illustrates a front cross-sectional view of the multiple drive assembly 302; and FIG. 5 illustrates a side view of the multiple drive assembly 302. The multiple drive assembly 302 can include a first storage unit 502 and a second storage unit 504. The first storage unit 502 and the second storage unit 504 are positioned along the same plane P1.

The multiple drive assembly 302 can further include a drive carrier 506. The drive carrier 506 can include a rail structure 508. The drive carrier 506 is a mechanical structure. The first storage unit 502 and the second storage unit 504 can be physically coupled to the drive carrier 506, and in particular, coupled to the rail structure 508. The drive carrier 506 can include a channel 507. In some examples, the channel 507 is a "U"-shaped channel. The channel 507 can be defined between sidewalls 509 of the rail structure 508 of the drive carrier 506. The drive carrier 506 facilitates coupling and decoupling of the first storage unit 502 and the second storage unit 504 from the chassis 204 and/or the server rack 202.

The first storage unit 502 can include a paddle card 510, and the second storage unit 504 can include a paddle card 512. The paddle cards 510, 512 can provide a connection point to the first storage unit 502, the second storage unit 504, respectively.

The multiple drive assembly 302 can further include a first storage link 514 (paddle card 514) and a second storage link 516 (paddle card 516). In some examples, the first storage link 514 and the second storage link 516 are printed circuit boards (PCBs). In some examples, the first storage link 514 and the second storage link 516 are flexible PCBs. The first storage link 514 can include a connector 520, and the second storage link 516 can include a connector 522. The first storage link 514 can be physically coupled to the first storage unit 502, and in particular, the connector 520 of the first storage link 514 can be coupled with the paddle card 510 of the first storage unit 502. The second storage link 516 can be physically coupled to the second storage unit 504, and in particular, the connector 522 of the second storage link 516 can be coupled with the paddle card 512 of the second storage unit 504.

The multiple drive assembly 302 can further include a first link control card (LCC) 530 and a second LCC 532. The first storage unit 502 can be positioned between the second storage unit 504 and the first LCC 530, the second LCC 532. The first LCC 530 and the second LCC 532 can be coupled to a paddle card 534. The paddle card 534 can be a PCB. The paddle card 534 can include connectors 536, 538. The first LCC 530 can be physically coupled to the first storage link 514. Specifically, the connector 536 of the paddle card 534 can be coupled to the first storage link 514, with the first LCC 530 coupled to the paddle card 534. Similarly, the second LCC 532 can be physically coupled to the first storage link 514. Specifically, the connector 538 of the paddle card 534 can be coupled to the first storage link 514, with the second LCC 532 coupled to the paddle card 534.

The multiple drive assembly 302 can further include a third storage link 550 (paddle card 550).

Figure 6:
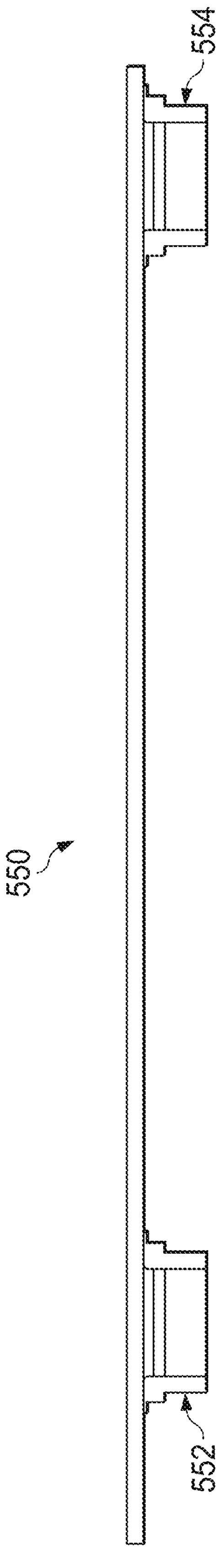
FIG. 6 illustrates a side view of a storage link of the multiple drive assembly.
Figure 7:
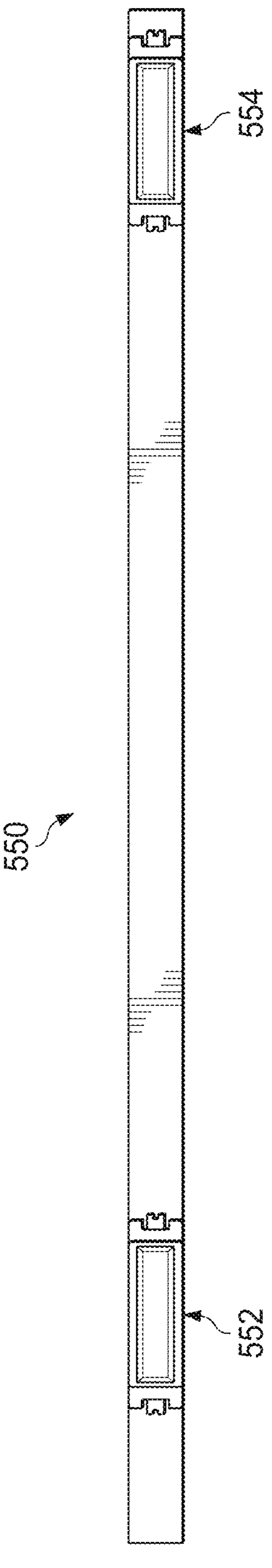
FIG. 7 illustrates a top down view of the storage link of the multiple drive assembly.

FIG. 6 illustrates a side view of the third storage link 550 of the multiple drive assembly 302; and FIG. 7 illustrates a top down view of the storage link 550 of the multiple drive assembly 302. Referring to FIGS. 4-7, in some examples, the third storage link 550 is a PCB. In some examples, the third storage link 550 is a flexible PCB. The third storage link 550 can include connectors 552, 554. The third storage link 550 is physically coupled to the drive carrier 506. Specifically, the third storage link 550 is coupled to the rail structure 508 of the drive carrier 506. The third storage link 550 is physically positioned within the channel 507 of the drive carrier 506. That is, the third storage link 550 "sits in" the "U"-shaped channel 507 of the drive carrier 506.

In short, the drive carrier 506 serves a dual purpose—enable coupling with the first storage devices 502 and the second storage device 504, as well as providing space for the third storage link 550 to carry signals from the first LCC 530 and/or the second LCC 532 to the second storage device 504.

The third storage link 550 is physically coupled between the first storage link 514 and the second storage link 516. Specifically, the connector 554 of the third storage link 550 is connected to the first storage link 514 to couple the third storage link 550 with the first storage link 514; and the connector 552 of the third storage link 550 is connected to the second storage link 516 to couple the third storage link 550 with the second storage link 516.

To that end, the first LCC 530 is coupled to the first storage unit 502 though the first storage link 514. That is, the first LCC 530 is coupled to the first storage link 514, and the first storage link 514 is coupled to the first storage unit 502, and thus, the first LCC 530 is coupled to the first storage unit 502 though the first storage link 514. Specifically, the first LCC 530 is coupled to the paddle card 534, the connector 536 of the paddle card 534 is connected to the first storage link 514, and the connector 520 of the first storage link 514 is connected with the paddle card 510 of the first storage unit 502. Thus, the first LCC 530 is able to communicate with the first storage unit 502, and control operation of the first storage unit 502. In other words, the first LCC 530 is in communication with the first storage unit 502 though the first storage link 514 such that the first LCC 530 can transmit data with the first storage unit 502 (e.g., read data from the first storage unit 502 and write data to the first storage unit 502).

Similarly, the second LCC 532 is coupled to the first storage unit 502 though the first storage link 514. That is, the second LCC 532 is coupled to the first storage link 514, and the first storage link 514 is coupled to the first storage unit 502, and thus, the second LCC 532 is coupled to the first storage unit 502 though the first storage link 514. Specifically, the second LCC 532 is coupled to the paddle card 534, the connector 538 of the paddle card 534 is connected to the first storage link 514, and the connector 520 of the first storage link 514 is connected with the paddle card 510 of the first storage unit 502. Thus, the second LCC 532 is able to communicate with the first storage unit 502, and control operation of the first storage unit 502. In other words, the second LCC 532 is in communication with the first storage unit 502 though the first storage link 514 such that the second LCC 532 can transmit data with the first storage unit 502 (e.g., read data from the first storage unit 502 and write data to the first storage unit 502).

Furthermore, the first LCC 530 is coupled to the second storage unit 504 though i) the connection between the first storage link 514 and the third storage link 550 and ii) the connection between the third storage link 550 and the second storage link 516. That is, the first LCC 530 is coupled to the first storage link 514, the first storage link 514 is coupled to the third storage link 550, the third storage link 550 is coupled to the second storage link 516, and the second storage link 516 is coupled to the second storage unit 504. Thus, the first LCC 530 is coupled to the second storage unit 504 though the first storage link 514, the third storage link 550, and the second storage link 516. Specifically, the first LCC 530 is coupled to the paddle card 534, the connector 536 of the paddle card 534 is connected to the first storage link 514, the connector 554 of the third storage link 550 is connected to the first storage link 514, the connector 552 of the third storage link 550 is connected to the second storage link 516, and the connector 522 of the second storage link 516 is coupled with the paddle card 512 of the second storage unit 504. Thus, the first LCC 530 is able to communicate with the second storage unit 504, and control operation of the second storage unit 504. In other words, the first LCC 530 is in communication with the second storage unit 504 though the first storage link 514, the second storage link 516, and the third storage link 550 such that the first LCC 530 can transmit data with the second storage unit 504 (e.g., read data from the second storage unit 504 and write data to the second storage unit 504).

Furthermore, the second LCC 532 is coupled to the second storage unit 504 though i) the connection between the first storage link 514 and the third storage link 550 and ii) the connection between the third storage link 550 and the second storage link 516. That is, the second LCC 532 is coupled to the first storage link 514, the first storage link 514 is coupled to the third storage link 550, the third storage link 550 is coupled to the second storage link 516, and the second storage link 516 is coupled to the second storage unit 504. Thus, the second LCC 532 is coupled to the second storage unit 504 though the first storage link 514, the third storage link 550, and the second storage link 516. Specifically, the second LCC 532 is coupled to the paddle card 534, the connector 538 of the paddle card 534 is connected to the first storage link 514, the connector 554 of the third storage link 550 is connected to the first storage link 514, the connector 552 of the third storage link 550 is connected to the second storage link 516, and the connector 522 of the second storage link 516 is coupled with the paddle card 512 of the second storage unit 504. Thus, the second LCC 532 is able to communicate with the second storage unit 504, and control operation of the second storage unit 504. In other words, the second LCC 532 is in communication with the second storage unit 504 though the first storage link 514, the second storage link 516, and the third storage link 550 such that the second LCC 532 can transmit data with the second storage unit 504 (e.g., read data from the second storage unit 504 and write data to the second storage unit 504).

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

What is claimed is:

1. A multiple drive assembly, including:
- a first storage unit;
- a second storage unit;
- a drive carrier including a rail structure for physically coupling the storage units to the drive carrier;
- a first storage link physically coupled to the first storage unit;
- a second storage link physically coupled to the second storage unit;
- a third storage link physically coupled between the first storage link and the second storage link, the third storage link physically coupled to the drive carrier; and
- a link control card (LCC) physically coupled to the first storage link,
- wherein the LCC is coupled to the first storage unit through the first storage link to place the LCC in communication with the first storage unit through the first storage link such that the LCC can transmit data with the first storage unit, and
- wherein the LCC is coupled to the second storage unit through i) the connection between the first storage link and the third storage link and ii) the connection between the third storage link and the second storage link to place the LCC in communication with the second storage unit through the first storage link, the second storage link, and the third storage link such that the LCC can transmit data with the second storage unit.

2. The multiple drive assembly of claim 1, wherein the first storage link and the second storage link are printed circuit boards (PCB).

3. The multiple drive assembly of claim 2, wherein the third storage link is a printed circuit board (PCB).

4. The multiple drive assembly of claim 2, wherein the third storage link is flexible printed circuit board (PCB).

5. The multiple drive assembly of claim 1, wherein the third storage link is coupled to the rail structure of the drive carrier.

6. The multiple drive assembly of claim 5, wherein the drive carrier includes a channel, wherein the third storage link is physically positioned within the channel.

7. The multiple drive assembly of claim 6, wherein the channel is a "U"-shaped channel.

8. The multiple drive assembly of claim 1, wherein the first storage unit is positioned between the second storage unit and the LCC.

9. The multiple drive assembly of claim 1, wherein the first storage unit and the second storage unit are positioned along the same plane.

10. A chassis, including: a plurality of multiple drive assemblies, each multiple drive assembly including:
- a first storage unit;
- a second storage unit;
- a drive carrier including a rail structure for physically coupling the storage units to the drive carrier;
- a first storage link physically coupled to the first storage unit;
- a second storage link physically coupled to the second storage unit;
- a third storage link physically coupled between the first storage link and the second storage link, the third storage link physically coupled to the drive carrier; and
- a link control card (LCC) physically coupled to the first storage link,
- wherein the LCC is coupled to the first storage unit through the first storage link to place the LCC in communication with the first storage unit through the first storage link such that the LCC can transmit data with the first storage unit, and
- wherein the LCC is coupled to the second storage unit through i) the connection between the first storage link and the third storage link and ii) the connection between the third storage link and the second storage link to place the LCC in communication with the second storage unit through the first storage link, the second storage link, and the third storage link such that the LCC can transmit data with the second storage unit.

11. The chassis of claim 10, wherein the first storage link and the second storage link are printed circuit boards (PCB).

12. The chassis of claim 11, wherein the third storage link is a printed circuit board (PCB).

13. The chassis of claim 11, wherein the third storage link is flexible printed circuit board (PCB).

14. The chassis of claim 10, wherein the third storage link is coupled to the rail structure of the drive carrier.

15. The chassis of claim 14, wherein the drive carrier includes a channel, wherein the third storage link is physically positioned within the channel.

16. The chassis of claim 15, wherein the channel is a "U"-shaped channel.

17. The chassis of claim 10, wherein the first storage unit is positioned between the second storage unit and the LCC.

18. The chassis of claim 10, wherein the first storage unit and the second storage unit are positioned along the same plane.

19. A server rack, including:
- a plurality of chassis, each chassis including a plurality of multiple drive assemblies, each multiple drive assembly including:
- a first storage unit;
- a second storage unit;
- a drive carrier including a rail structure for physically coupling the storage units to the drive carrier;
- a first storage link physically coupled to the first storage unit;

a second storage link physically coupled to the second storage unit;

a third storage link physically coupled between the first storage link and the second storage link, the third storage link physically coupled to the drive carrier; and a link control card (LCC) physically coupled to the first storage link;

wherein the LCC is coupled to the first storage unit through the first storage link to place the LCC in communication with the first storage unit through the first storage link such that the LCC can transmit data with the first storage unit, and wherein the LCC is coupled to the second storage unit through i) the connection between the first storage link and the third storage link and ii) the connection between the third storage link and the second storage link to place the LCC in communication with the second storage unit through the first storage link, the second storage link, and the third storage link such that the LCC can transmit data with the second storage unit.

20. The server rack of claim 19, wherein the first storage link and the second storage link are printed circuit boards (PCB).

* * * * *